US006915248B1

(12) United States Patent
Ip

(10) Patent No.: US 6,915,248 B1
(45) Date of Patent: Jul. 5, 2005

(54) METHOD AND APPARATUS FOR TRANSFORMING TEST STIMULUS

(75) Inventor: Chung-Wah Norris Ip, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/340,580

(22) Filed: Jun. 28, 1999

(51) Int. Cl.[7] .............................................. G06F 17/50
(52) U.S. Cl. .......................................... 703/14; 703/17
(58) Field of Search .............................. 703/14, 17, 15, 703/16; 714/736, 738; 716/14, 15, 16

(56) References Cited

U.S. PATENT DOCUMENTS

| | | | | |
|---|---|---|---|---|
| 4,745,355 A | * | 5/1988 | Eichelberger et al. | .... 324/73 R |
| 4,761,607 A | * | 8/1988 | Shiragasawa et al. | ....... 324/752 |
| 4,801,870 A | * | 1/1989 | Eichelberger et al. | ...... 714/736 |
| 4,817,093 A | * | 3/1989 | Jacobs et al. | .................. 371/25 |
| 5,323,401 A | * | 6/1994 | Maston | ......................... 371/27 |
| 5,638,383 A | * | 6/1997 | Wotzak et al. | .............. 371/22.5 |
| 5,649,164 A | * | 7/1997 | Childs et al. | ................ 395/500 |
| 5,650,946 A | * | 7/1997 | Trimberger | .................. 364/578 |
| 5,794,005 A | * | 8/1998 | Steinman | ..................... 395/500 |
| 5,801,938 A | * | 9/1998 | Kalantery | .................... 364/131 |
| 5,825,785 A | * | 10/1998 | Barry et al. | ................ 371/22.4 |
| 5,867,399 A | * | 2/1999 | Rostoker et al. | ............. 364/489 |
| 5,920,830 A | * | 7/1999 | Hatfield et al. | .............. 702/119 |
| 5,966,306 A | * | 10/1999 | Nodine et al. | .......... 364/468.28 |
| 6,341,262 B1 | * | 1/2002 | Damani et al. | ................ 703/16 |
| 6,510,405 B1 | * | 1/2003 | Gilbertson | .................... 703/16 |

OTHER PUBLICATIONS

Pitro Zafiropulo, Colin H. West, Harry Rudin, D.D. Cowan, and Daniel Brand (Apr. 1980) "Towards Analyzing and Synthesizing Protocols," *IEEE Transactions on Communications*, 28 (4).

A. Bouajjani, S. Bensalem, S. Graf, C. Loiseaux, and J. Sifakis (1993) "Property Preserving Abstractions for the Verification of Concurrent Systems," *Formal Methods in System Design*, 6(1):11–44.

J.R. Burch, E.M. Clarke, K.L. McMillan, D.L. Dill, and L.J. Hwang (1990) "Symbolic Model Checking: 10°States and Beyond," *5th IEEE Symposium on Logic in Computer Science*.

G.J. Holzmann (1995) "An Analysis of Bistate Hashing," *15th International Conference on Protocol Specification, Testing and Verification*.

U. Stern and D.L. Dill (1995) "Improved Probabilistic Verification by Hash Compaction," *Advanced Research Working Conference on Correct Hardware Design and Verification Methods*.

Aharon Aharon, Dave Goodman, Moshe Levinger, Yossi Lichtenstein, Yossi Malka, Charlotte Metzger, Moshe Molcho, Gil Shurek (1995) "Test Program Generation for Functional Verification of Power PC Processors in IBM," *32nd Design Automation Conference*.

Elaine J. Weyuker and Bingchiang Jeng (Jul. 1991) "Analyzing Partition Testing Strategies," *IEEE Transactions on Software Engineering*, vol. 17, No. 7, Jul. 1991.

(Continued)

*Primary Examiner*—Thai Phan
(74) *Attorney, Agent, or Firm*—Reed Smith LLP.; John W. Carpenter

(57) ABSTRACT

Described is a method for validating a digital design using a simulation process. All possible design states of the design are divided into a plurality of validation regions. In the simulation-process, the method records and updates the simulation history for each of t he validation region. When a particular stimulus is specified by the designer to perform a step of simulation for a current state within one of the validation regions, the process determines simulation efficiency by examining the specified stimulus and the simulation history of the validation region. The method may transform the specified stimulus into a more interesting stimulus to improve the efficiency and coverage of the simulation process.

44 Claims, 11 Drawing Sheets

OTHER PUBLICATIONS

Daniel Lenoski, James Laudon, Kourosh Gharachorloo, Wolf–Dietrich Weber, Anoop Gupta, John Hennessy, Mark Horowitz, and Monica Lam (1992) "The Stanford DASH Multiprocessor," *Computer, 25(3)*.

A. Chandra, V. Iyengar, D. Jameson, R. Jawalekar, I Nair, B. Rosen, M. Mullen, J. Yoon, R. Armoni, D. Geist, and Y. Wolfsthal (1995) "AVPGEN—A Test Generator for Architecture Verification," *IEEE Transactions on VLSI Systems*, vol. 3, No. 2.

"Spec–Based Verification," *Verisity Design, Inc.,* (Jun. 1998).

S. Bose and A.L. Fisher (1989), "Verifying Pipelined Hardware Using Symbolic Logic Simulation," *International Conference on Computer Design: VLSI in Computers and Processors*.

C. Han Yang and David L. Dill (1998), "Validation With Guided Search of the State Space," *35th Design Automation Conference*.

* cited by examiner

METHOD AND APPARATUS FOR TRANSFORMING TEST STIMULUS

FIELD OF THE INVENTION

The present invention relates generally to digital design validations, and more specifically to digital design validations using a sequence of test stimuli or a stimulus specification.

BACKGROUND OF THE INVENTION

Using Hardware Description Language (HDL), a digital design can be first described at an abstract level (i.e. Register Transfer Level—RTL or above) in terms of its functionality and data flow. The functionality of the digital design is validated before the digital design is fabricated on a chip. A logic synthesis tool then converts the RTL description to a gate-level netlist, which is a description of the digital design in terms of gates and connections among them. An automatic place and route tool subsequently creates a physical layout based on the gate-level netlist. The physical layout for the digital design is finally fabricated on a chip.

There exist two approaches to validating digital designs, namely, a simulation approach and a formal verification approach. Simulation is traditionally the main tool to perform a digital design validation. Specifically, a simulation tool receives an executable description of a digital design and a sequence of test stimuli, and then executes the description using the sequence of stimuli as inputs. The simulation tool validates the correctness of the design by comparing the simulated outputs with the desired outputs. However, as the complexity of a digital design increases, it is difficult to write a set of test stimuli sequences that would simulate all aspects of a digital design. Due to the limitations of a selected sequence of test stimuli, a simulation process may only cover some aspects of all possible functionality scenarios. This is known as the coverage problem. To improve coverage, a great effort has been made in manually improving test stimuli for validating different aspects of a digital design. Because a designer who is writing test stimuli sequences may not be able to fully anticipate complex scenarios in a design, a substantial portion of simulation time can be wasted in repetitively validating the same or similar functionality scenarios, leaving some other scenarios un-validated. In addition, manually writing a set of test stimuli sequences is a tedious and time-consuming task.

Unlike simulation, formal verification, a relatively newer approach, does not need a set of test stimuli to perform digital design validations. Instead, formal verification enumerates all possible test stimuli, in accordance with a stimulus specification, to validate a digital design. Thus, formal verification offers complete coverage for digital design validations. However, formal verification requires much larger memory space than simulation. Typically, even for a digital design with moderate complexity, formal verification may require more than 10 GB (Giga Byte) of memory space. Hence, formal verification is not feasible to validate complex digital designs due to memory limitations in existing formal verification tools.

Furthermore, most previous digital designs have been validated on simulation infrastructure. During many years of practice, the circuit design industry has accumulated extensive expertise (or intellectual property, such as a database of test stimuli) in, and made huge investment in, simulation infrastructure. Because of these expertise and investment, it is not feasible for the industry to totally abandon existing simulation infrastructure and build formal verification infrastructure from scratch.

There is, therefore, a need for a method and apparatus to validate digital designs with improved validation coverage and simulation efficiency.

There is another need for a method and apparatus to validate digital designs with improved validation coverage without requiring an excessive memory space.

There is yet another need for a method and apparatus to validate digital designs with improved validation coverage using a set of stimuli that may be not complete and well designed.

There is still another need for a method and apparatus to utilize welldeveloped existing simulation tools and infrastructures to validate increasingly complex digital designs with improved coverage and reduced simulation time.

The present invention provides a method and apparatus to meet these needs.

SUMMARY OF THE INVENTION

To address the shortcomings of the prior art, the present invention provides a novel method to validate circuit designs.

In a broad aspect, the present invention provides a method for performing a simulation process for a design using a set of existing stimuli that are specified in a predetermined sequence. The method comprises the steps of: dividing all possible design states into a plurality of validation regions; recording simulation history for all the validation regions during the simulation process; generating a new set of stimuli by examining the existing stimuli based on the simulation history; and performing the process using the new set of stimuli.

In another aspect, the present invention provides a method for performing a simulation process for a design using a set of existing stimuli that are specified in a predetermined sequence. The method comprises the steps of: dividing all possible validation states for the design into a plurality of validation regions; recording simulation history for each of the validation regions during the simulation process; taking a stimulus from the existing stimuli for performing a next simulation step for a current validation region, wherein the stimulus is taken in an order specified by the predetermined sequence; examining the simulation history for the taken stimulus in the current validation region; and transforming the taken stimulus into an interesting stimulus based on the simulation history.

In yet another aspect, the present invention provides a method for performing a simulation process using a stimulus specification. The method comprises the steps of: dividing all possible design states for the design into a plurality of validation regions; recording simulation history for each of the validation regions during the simulation process; and generating an interesting stimulus in accordance with the stimulus specification based on the simulation history of the validation regions.

In still another aspect, the present invention provides a method for performing a simulation process using a set of exiting stimuli that are specified in a predetermined sequence. The design has M design inputs, and each of the stimuli has M values for its respective design inputs. The method comprises the steps of: defining N different partitions for the design, each of the partitions dividing the design states into a plurality of validation regions; associating each of the design inputs with one of the N partitions, so that each of the validation regions in each of the partitions is associated with at least one of the M design inputs; recording simulation history for each of the validation regions in each of the partitions during the simulation process; taking a stimulus from the set of existing stimuli for a next simulation step, wherein the stimulus is taken in an order specified by the predetermined sequence; and transforming the taken stimulus into an interesting stimulus based on the simulation history.

The present invention also provides corresponding apparatuses for performing the steps in the methods described above.

BRIEF DESCRIPTION OF THE DRAWING

The aforementioned advantages of the present invention as well as additional advantages thereof will be more clearly understood hereinafter as a result of the following detailed description of the embodiments of the invention, taken in conjunction with the following drawings in which.

DETAILED DESCRIPTION OF PREFERRED EMBODIMENTS

To overcome the shortcomings of the available art, the present invention discloses a novel method and apparatus for validating digital designs.

Figure 1:
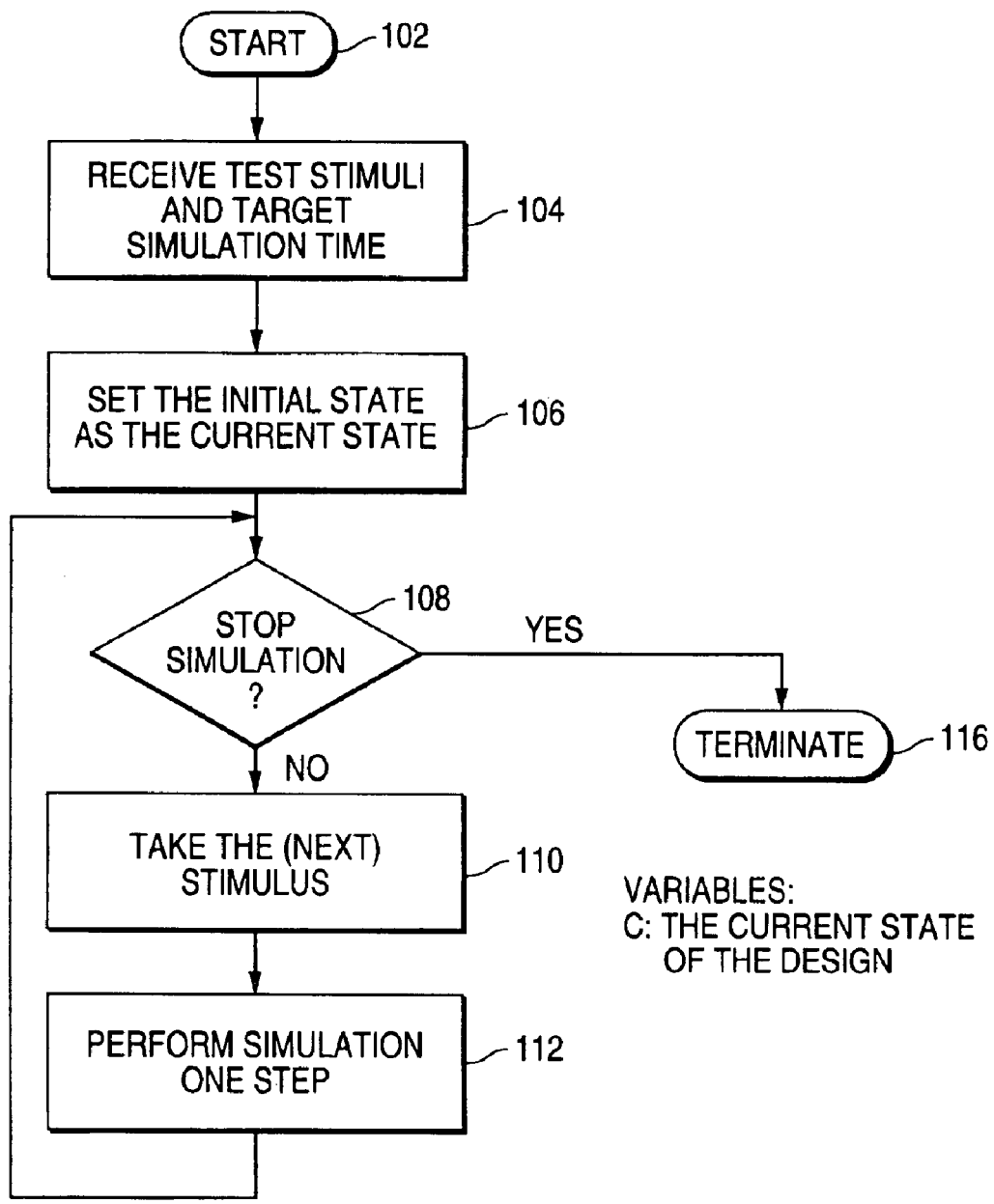
FIG. 1 is a flowchart illustrating a simulation process, in accordance with prior art.

FIG. 1 is a flowchart illustrating a traditional simulation process to validate a digital design.

Before performing the simulation process shown in FIG. 1, a memory region C is set to store the current state.

Step 104 receives a sequence of test stimuli provided by the designer (or user) to simulate certain aspects of a digital design, and a target simulation time provided by the designer to indicate when to terminate the simulation process.

Step 106 stores the initial state in the memory region C to set the initial state as the current state of the digital design.

Step 108 determines whether to terminate the simulation process. The simulation can be terminated in two situations: (1) if the target simulation time is reached, or (2) the execution of the simulation specifies a termination. If step 108 determines to terminate the simulation process, the operation is led to step 116 to terminate the process. If step 108 determines not to terminate the simulation process, the operation is led to step 110.

Step 110 takes a (next) stimulus from the sequence of the test stimuli in an order specified by the designer who provided the sequence.

Using the designer specified stimulus, step 112 performs one simulation step that updates the current state in the memory region C with a successor state generated by the one simulation step. The operation is then led to step 108 to determine whether to terminate the simulation process.

It should be noted that a traditional simulation process performs simulation using a sequence of test stimuli in an order specified by the designer. Hence, the coverage of design scenarios depends solely on the designer-specified sequence of test stimuli. Several or many simulation steps may be unnecessarily repeated in the simulation process, thus wasting simulation time and reducing coverage.

Figure 2:
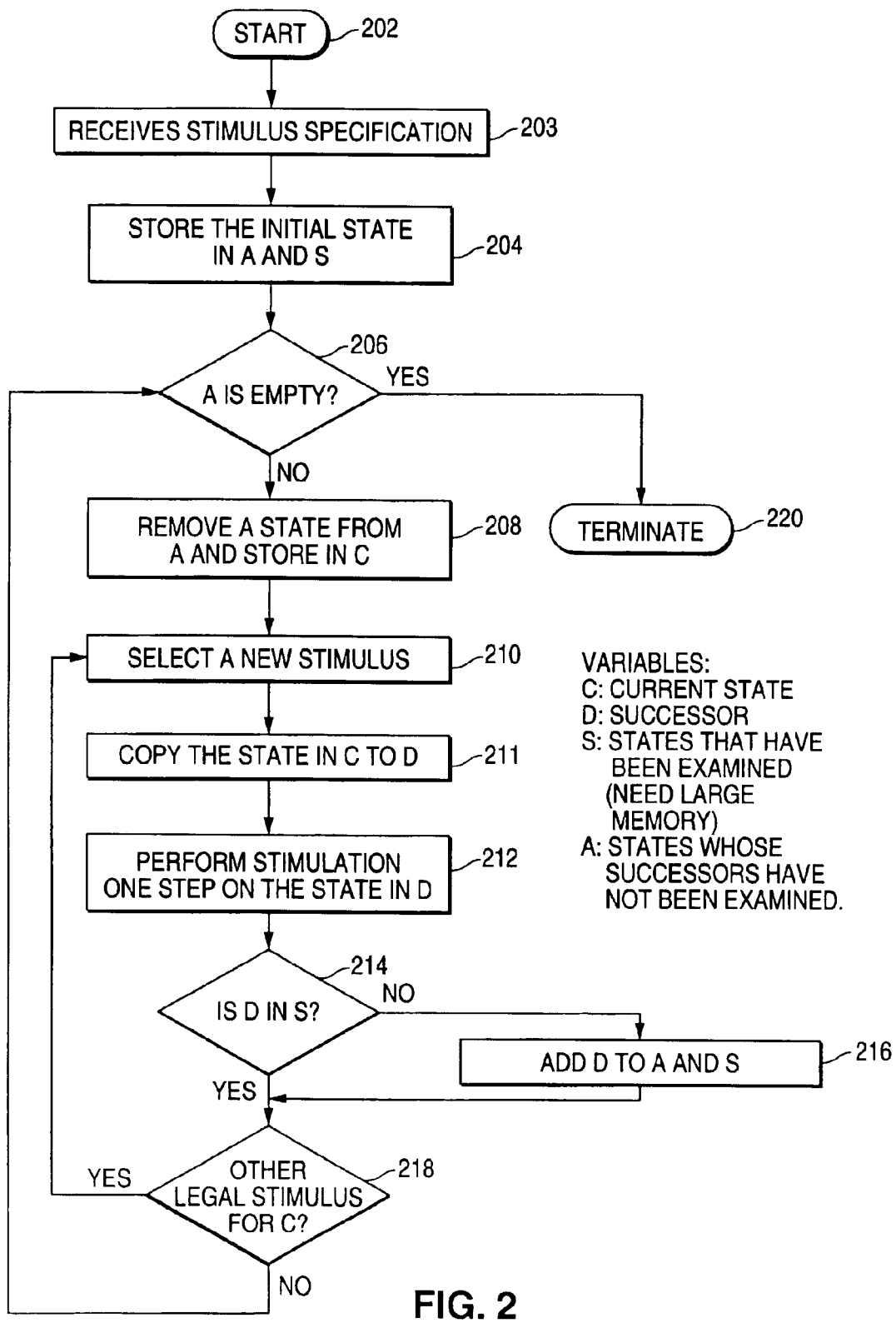
FIG. 2 is a flowchart illustrating a formal verification process to validate a circuit design, in accordance with prior art.

FIG. 2 is a flowchart illustrating a traditional formal verification process to validate a digital design.

Before performing the formal verification process, a memory region S is set to store the states that have been generated (called reachable states), a memory region A is set to store the states whose successor states have not been generated (called active states), a memory region C is set to store the current state, and a memory region D is set to store a successor state of the current state.

As shown in FIG. 2, step 203 receives a stimulus specification, provided by a designer, which summarizes what kinds of stimuli are possible and under what scenarios each of the possible stimuli may occur. For a current state in a particular simulation step, the stimulus specification indicates the possible stimuli that may occur, so that the verification process can exhaustively verify all possible stimuli one by one.

Step 204 stores the initial state in the memory regions A and S so that step 208 below can take the initial s tate and set it as the current state.

Step 206 determines whether there is any active state. At the very beginning, the memory region A contains only one state—the initial state, whose successors have not been generated. If there is no active state (that is, the memory region A is empty), the operation is led to step 220 to terminate the formal verification process. If there are active state(s), the operation is led to step 208.

Step 208 removes a state from the memory region A, and stores the state to the memory region C to set the state as the current state.

Step 210 selects a new stimulus for the current state in the memory region C according to the stimulus specification.

Step 211 copies the current state from the memory region C to the memory region D.

Using the stimulus selected in step 210, step 212 simulates one step that updates the state in the memory region D with a successor state generated by the one simulation step.

Step 214 determines whether the successor state in the memory region D is the same as one of the states in the memory region S. If the successor state in the memory region D is the same as one of the states in the memory region S, the operation is led to step 218. If the successor state in the memory region D is not the same as any one of the states in the memory region S, the operation is led to step 216.

Step 216 adds the successor state to the memory regions A and S. The operation is then led to step 218.

Step 218 determines whether other possible stimuli exist for the current state in the memory region C according to the stimulus specification. If there exist any other possible stimuli for the current state, the operation is led to step 210 to select a new stimulus. If there exist no other possible stimuli for the current state, the operation is led to step 206 to select an active state from the memory region A.

A state is called a verified state if all of its successor states have been generated. In the verification process shown in FIG. 2, step 214 uses the information stored in the memory region S to avoid storing a previously verified state into the memory region A, thus guaranteeing the termination of the verification process once all reachable states are exhaustively verified. The memory region S can take a huge amount of memory space because all reachable states have to be kept in the memory region S during the formal verification process. In many cases, step 216 will fail because there is not enough memory in the memory region S, leading to an early termination of the formal verification process with only a portion of the design verified.

Figure 3A:
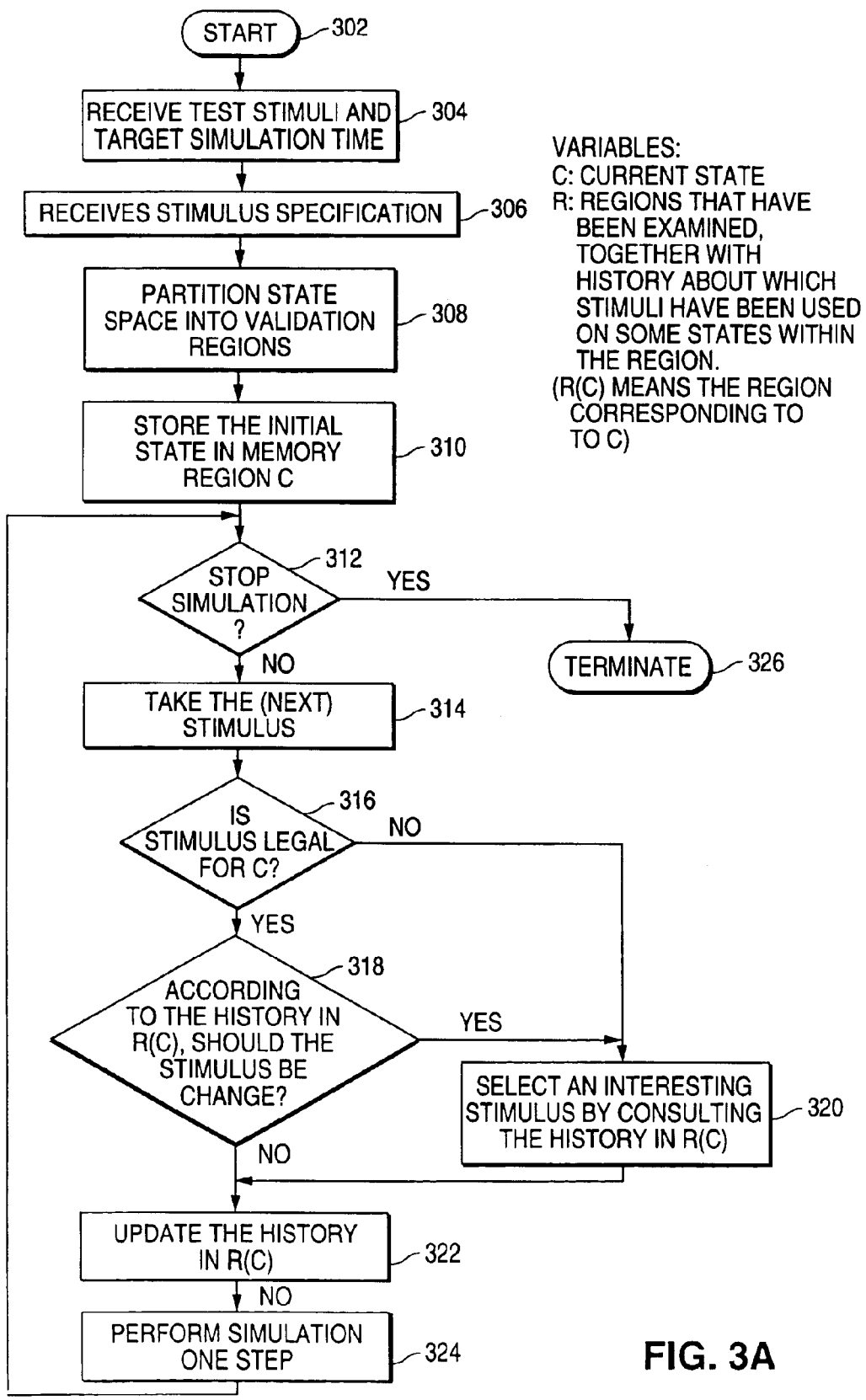
FIG. 3A is a flowchart illustrating a simulation process, in accordance with one embodiment of the present invention.

FIG. 3A is a flowchart illustrating a simulation process to validate a digital design, in accordance with one embodiment of the present invention.

Before performing the simulation process shown in FIG. 3A, a memory region C is set to store the current state of the simulation process, and a memory region R is set to store the simulation history of a set of validation regions. In the present invention, each validation region corresponds to a set of states, and these regions are defined in Step 308. Simulation history of a validation region can be regarded as any information that summarizes what has happened when the design state is one of the states represented by the validation region. For example, in the current implementation of the present invention, the simulation history of each validation region records the number of occurrences for each of the possible test stimuli used when the current state was within the validation region during the simulation process. Timing information and other simulation history information may also be used.

As shown in FIG. 3A, step 304 receives a sequence of test stimuli provided by the designer to simulate certain aspects of a digital design, and a target simulation time provided by the designer to indicate when to terminate the simulation process. Compared to the traditional simulation process, the simulation process of the present invention does not require the test stimuli to be well written to generate improved simulation coverage and simulation efficiency.

Step 306 receives a stimulus specification, provided by the designer, which summarizes what kinds of stimuli are possible and under what scenarios each of the possible stimuli may occur. Compared to the traditional formal verification, the stimulus specification for the current invention needs not be complete. This is so because the simulation process of the present invention does not claim complete coverage (simulate all stimuli exhaustively for every reachable state).

Step 308 divides a state space containing all validation states into multiple validation regions. Each of the validation regions contains a set of design states in the state space. In the current implementation, selected state-holding elements in the design are used to define a set of regions, so that different states with the same values in these state-holding elements are defined to be in the same region. Simulation history will be maintained for each validation region during simulation. In the current implementation, each of the validation regions is indexed to a hash table, and the records in the hash table store the corresponding simulation history of the validation regions. Upon identifying a state (an initial state or a successor state), the simulation process of the present invention is able to recognize which validation region the state belongs to. For example, the values in the selected state-holding elements may be used as the keys to the hash table.

Step 310 stores the initial state of the digital design in the memory region C to set the initial state as the current state. The validation region that contains the current state is called the current validation region, which is denoted as R(C) in the flowcharts shown in FIGS. 3A–B.

Step 312 determines whether to terminate the simulation process. The simulation process can be terminated in two situations: (1) if the target simulation time is reached, or (2) the execution of the simulation process specifies a termination. If step 312 determines to terminate the simulation process, the operation is led to step 326 to terminate the process. If step 312 determines not to terminate the simulation process, the operation is led to step 314.

Step 314 takes a (next) stimulus from the sequence of the test stimuli in an order specified by the designer who provides the sequence. Step 316 determines whether the stimulus taken at step 314 is legal, meaning that the stimulus taken at step 314 can occur in complying with the stimulus specification. If the stimulus is legal for the current state, the operation is led to step 318; if the stimuli is not legal, the operation is led to step 320. Step 316 is necessary because the simulation process of the present invention may change the test stimuli specified by the designer. The previous simulation step may use a stimulus not specified by the designer. Therefore, the stimulus taken at step 314 may be unable to occur in accordance with the stimulus specification.

Step 318 further determines whether the specified stimulus taken in step 314 should be changed, in reference to the simulation history of the current validation region, as stored in the memory Region R. For example, the simulation history may record the number of occurrence of each possible stimuli for each validation region, and the simulation process may checks whether the number of occurrence of the stimulus taken at step 314 exceeds a predetermined value (1, 2, or 3). If the number of occurrence does not exceed the predetermined value, the operation is led to step 322; if the number of occurrence exceeds the predetermined value, the operation is led to step 320.

A design usually has one or more inputs. A stimulus defines the values of these inputs for the next simulation step. Step 320 selects an interesting stimulus by consulting the simulation history for the current validation region, as stored in the memory Region R. This transformation process examines the stimulus taken at Step 314 and the simulation history for the current validation region, and modifies the value at each input to a more interesting value. The stimulus obtained at step 320 often simulates a different aspect of the digital design, which often directs the simulation process to another validation region, thus reducing or eliminating unnecessary simulation repetitions and improving the simulation efficiency. The operation is then led to step 322.

Step 322 updates the simulation history of the current validation region, as stored in the memory Region R to reflect the fact that the stimulus selected at either step 314 or step 320 is used one more time for the current validation region.

Step 324 performs one simulation step using the stimulus generated at step 314 or step 320. Step 324 also updates the current state in the memory region C with the successor state generated in the one simulation step.

It should be appreciated that the simulation process shown in FIG. 3A overcomes the shortcomings in the simulation process shown in FIG. 1. The simulation process shown in FIG. 1 takes the current state and a subsequent stimulus, and generates a successor state from the current state. If later in the simulation process, the same current state is reached and the same stimulus is specified by the designer, the same successor state will be generated, leading to duplicated simulation work. By the same token, if a similar current state is reached and the same stimulus is used, a similar successor state may be generated. Although the similar successor state is not a duplication of the previous successor state, it is unlikely to detect a new bug in the design.

By contrast, the simulation process shown in FIG. 3A can detect whether the same stimulus has been used on a state similar to the current state, by looking up the simulation history for the current validation region. By transforming a stimulus specified from the sequence of stimuli provided by the designer, the simulation process of the present invention can eliminate or reduce unnecessary simulation repetitions.

Compared to the formal verification process shown in FIG. 2, the memory region R in the simulation process of the present invention only stores the simulation history for each of the validation regions that has been examined. The number of validation regions can be reduced and their simulation history can be simplified to fit into memories of different sizes. Thus, the memory region R in the simulation process shown in FIG. 3A takes much smaller memory space than memory region S in the formal verification process shown in FIG. 2, and therefore, the process would not terminate early because of memory limitation.

Figure 3B:
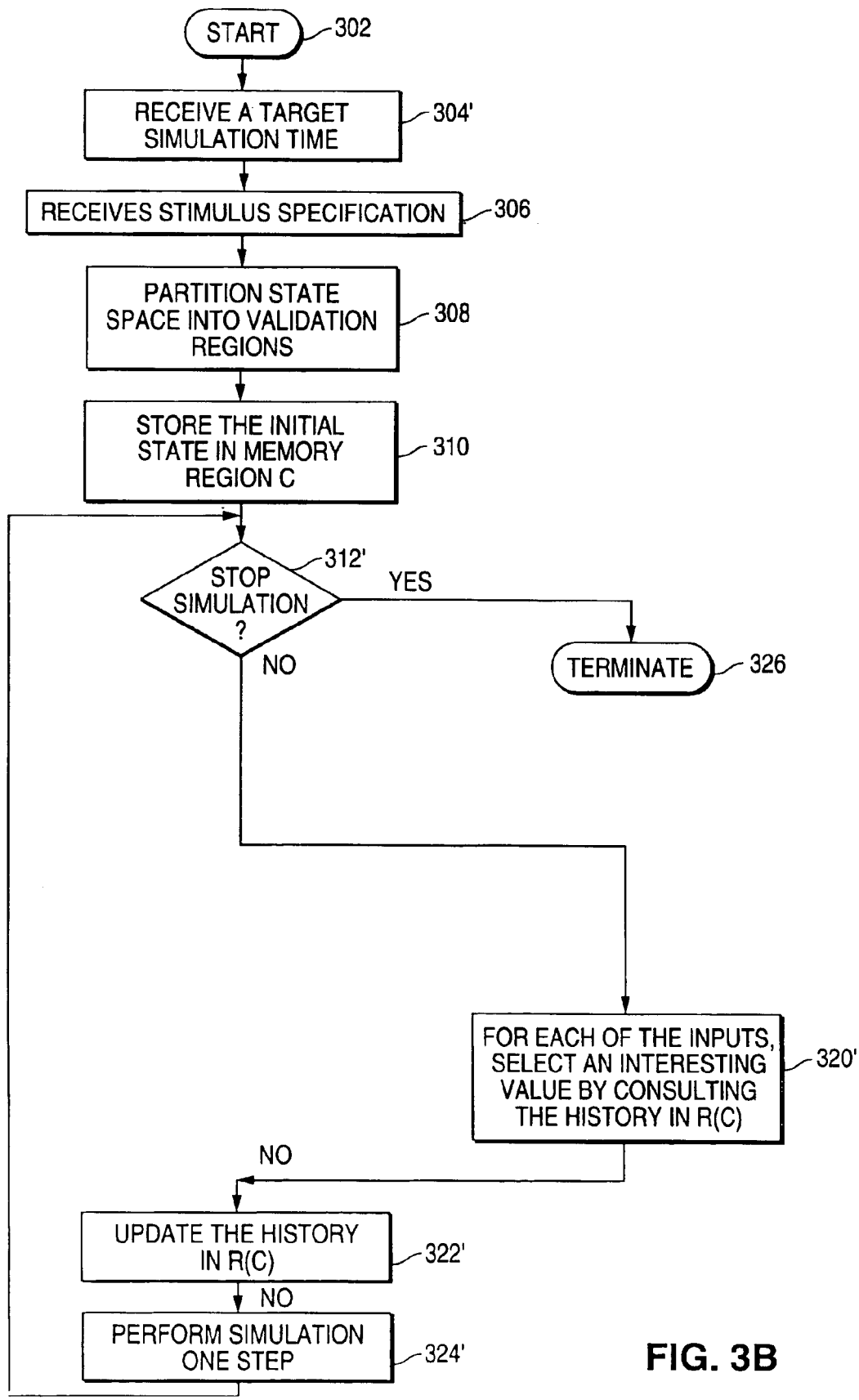
FIG. 3B is a flowchart illustrating a simulation process, in accordance with another embodiment of the present invention.

FIG. 3B is a flowchart illustrating a simulation process to validate a digital design, in accordance with another embodiment of the present invention.

Like the process shown in FIG. 3A, the process of FIG. 3B also uses a memory region C to store the current state in the simulation process, and a memory region R to store the simulation history for the validation regions.

It is noted that the simulation process shown in FIG. 3B comprises five steps that perform the same functions as the corresponding five steps shown in FIG. 3A. Where the same steps shown in FIG. 3A are used in FIG. 3B, the same reference numerals are used. Theses five steps are 302, 306, 308, 310, and 326.

As shown in FIG. 3B, step 304' receives a target simulation time provided by the designer to indicate when to terminate the process.

The functions of steps 306, 308, and 310 in FIG. 3B have been described in connection with the corresponding steps in FIG. 3A. Thus, they will not be described here.

Following step 310, step 312' determines whether to terminate the simulation process. The simulation process can terminated in two situations: (1) if the target simulation time is reached, or (2) the execution of the simulation process specifies a termination. If step 312' determines to terminate the simulation process, the operation is led to step 326 to terminate the process. If step 312' determines not to terminate the simulation process, the operation is led to step 320'.

Step 320' selects an interesting stimulus by consulting simulation history for the current validation region, as stored in the memory Region R. This transformation process examines the simulation history for the current validation region, and selects an interesting value at each input. Step 322' updates the simulation history of the current validation region, as stored in the memory Region R, to reflect the fact that the stimulus selected at step 320' is used one more time for the current validation region.

Step 324' performs one simulation step using the stimulus generated at step 320'. Step 324' also updates the current state in the memory region C with the successor state generated in the one simulation step.

Compared to the simulation process shown in FIG. 3A, the simulation process shown in FIG. 3B does not require the designer to specify a sequence of stimuli.

Figure 3C:
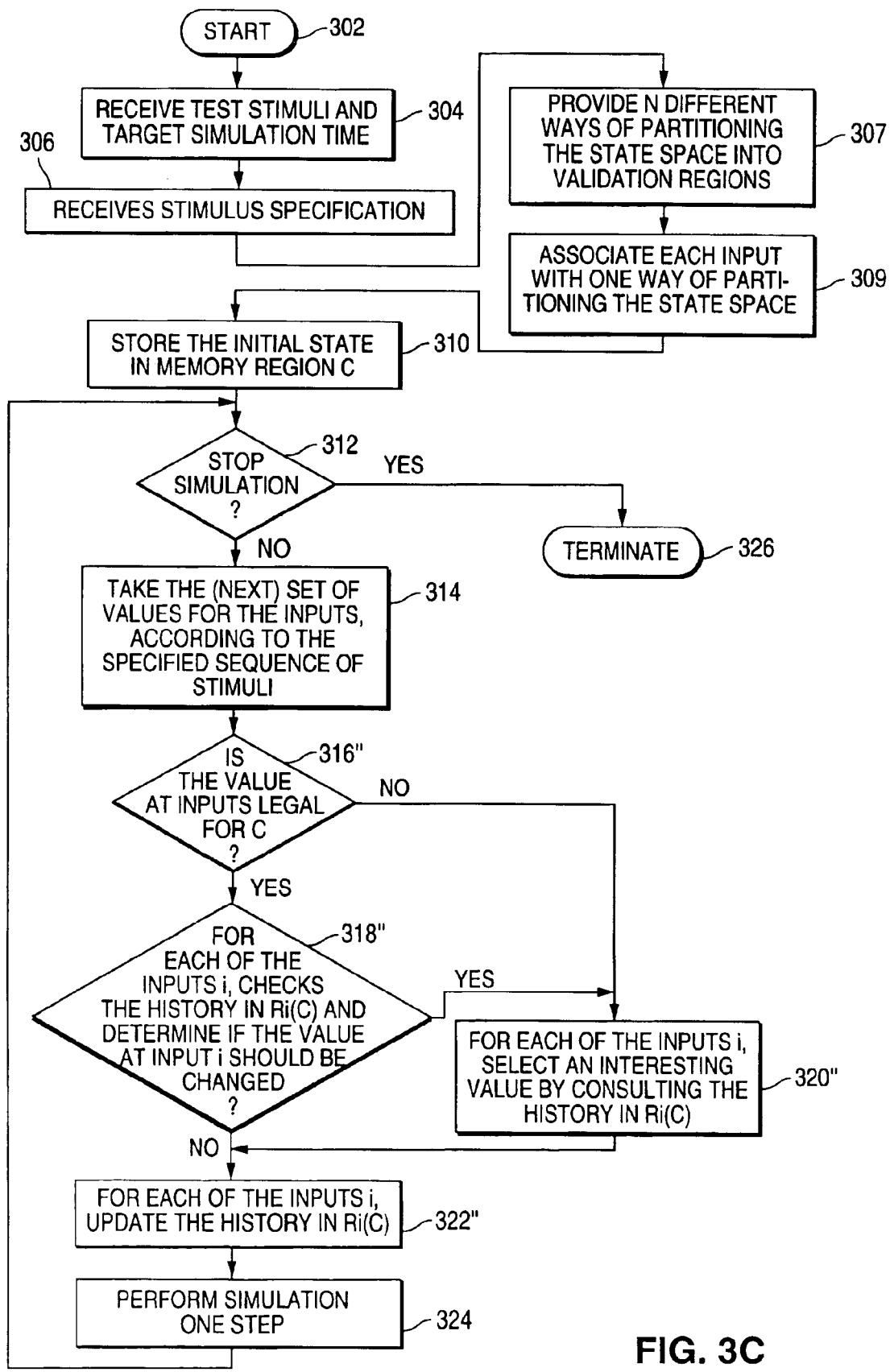
FIG. 3C is a flowchart illustrating a simulation process, in accordance with still another embodiment of the present invention.

FIG. 3C is a flowchart illustrating a simulation process to validate a digital design, in accordance with still another embodiment of the present invention.

Like the process shown in FIG. 3A, the process of FIG. 3C also uses a memory region C to store the current state in the simulation process, and a memory region R to store the simulation history for the validation regions.

It is noted that the simulation process shown in FIG. 3C comprises six steps that perform the same functions as the corresponding six steps shown in FIG. 3A. Where the same steps shown in FIG. 3A are used in FIG. 3C, the same reference numerals are used. These six steps are 302, 304, 306, 310, 312, and 314.

The functions of steps 304, and 306 in FIG. 3C have been described in connection with the corresponding steps in FIG. 3A. Thus, they will not be described here.

Following step 306, step 307 provides N different ways of dividing the state space into validation regions.

A design usually has one or more inputs. A stimulus defines the values of these inputs for the next simulation step. Step 309 associates each input of the design with one way of dividing the state space into validation regions, and different inputs may have different ways of dividing the state space. For example, a cache controller in a design may have inputs from a processor and a memory. The set of validation regions associated with the inputs from the processor may be different from the set of validation regions associated with the inputs from the memory. The validation region, which contains the current state and is associated with the stimulus input i, is called the current validation region for input i and denoted as Ri(C) in FIG. 3C. For different inputs i and j, Ri(C) and Rj(C) may differ. The operation is then led to step 310.

The functions of steps 310, 312, and 314 have been described in connection with the corresponding steps in FIG. 3A. Thus, they will not be described here.

Following step 314, step 316" determines whether the stimulus taken at step 314 is legal, meaning that the stimulus taken at step 314 can occur in complying with the stimulus specification. If the stimulus is legal for the current state, the operation is led to step 318". If the stimulus is not legal, the operation is led to step 320". Step 316" is necessary because the simulation process of the present invention may change the test stimuli specified by the designer. The previous simulation step may use a stimulus not specified by the designer. Therefore, the stimulus taken at step 314 may be unable to occur in accordance with the stimulus specification.

For each input i, step 318" further determines whether the value specified for input i by the stimulus taken in step 314 should be changed, in reference to the simulation history of the current validation region for input i, as stored in the memory region Ri(C). For example, the simulation history may record the number of occurrence of each possible value at input i for each validation region, and the simulation process checks whether the number of occurrences of the value at input i as specified in the taken stimulus at step 314 exceeds a predetermined value (1, 2, or 3). If the number of occurrences does not exceed the predetermined value, the operation is led to step 322". If the number of occurrences exceeds the predetermined value, the operation is led to step 320".

For each input i, step 320" selects an interesting value for input i by consulting the simulation history for the current validation region for input i, as stored in the memory region Ri(C). This transformation process examines the stimulus taken at Step 314, and the simulation history of the current validation region for input i, and modifies the value of input i to a more interesting value. The stimulus obtained at step 320" often simulates a different aspect of the digital design, which often directs the simulation process to another validation region, thus reducing or eliminating unnecessary simulation repetitions and improving simulation efficiency. The operation is then led to step 322".

For each input i, Step 322" updates the simulation history of the current validation region for input i, as stored in the memory region Ri(C), to reflect the fact that the value of input i, selected as part of the stimulus at either step 314 or step 320", is used one more time for the current validation region for input i.

Step 324" performs one simulation step using the stimulus generated at step 314 or step 320". Step 324" also updates the current state in the memory region C with the successor state generated in the one simulation step. The operation is then led to step 312.

In the embodiment shown in FIG. 3C, several different divisions of the state space can be used in one simulation process. This allows for customizing the division of the state space for each input. The improvement in coverage for the present invention depends on the ways the state space is divided. Using the embodiment in FIG. 3A, if only one region is used, it degenerates to have very limited improvement in coverage. If each region contains only one state, it degenerates to have a very large memory requirement. This embodiment of the present invention allows the designer to customize the regions for different inputs. Therefore, it provides for better control over the amount of memory to use and usually leads to better improvement in coverage.

Figure 4A:
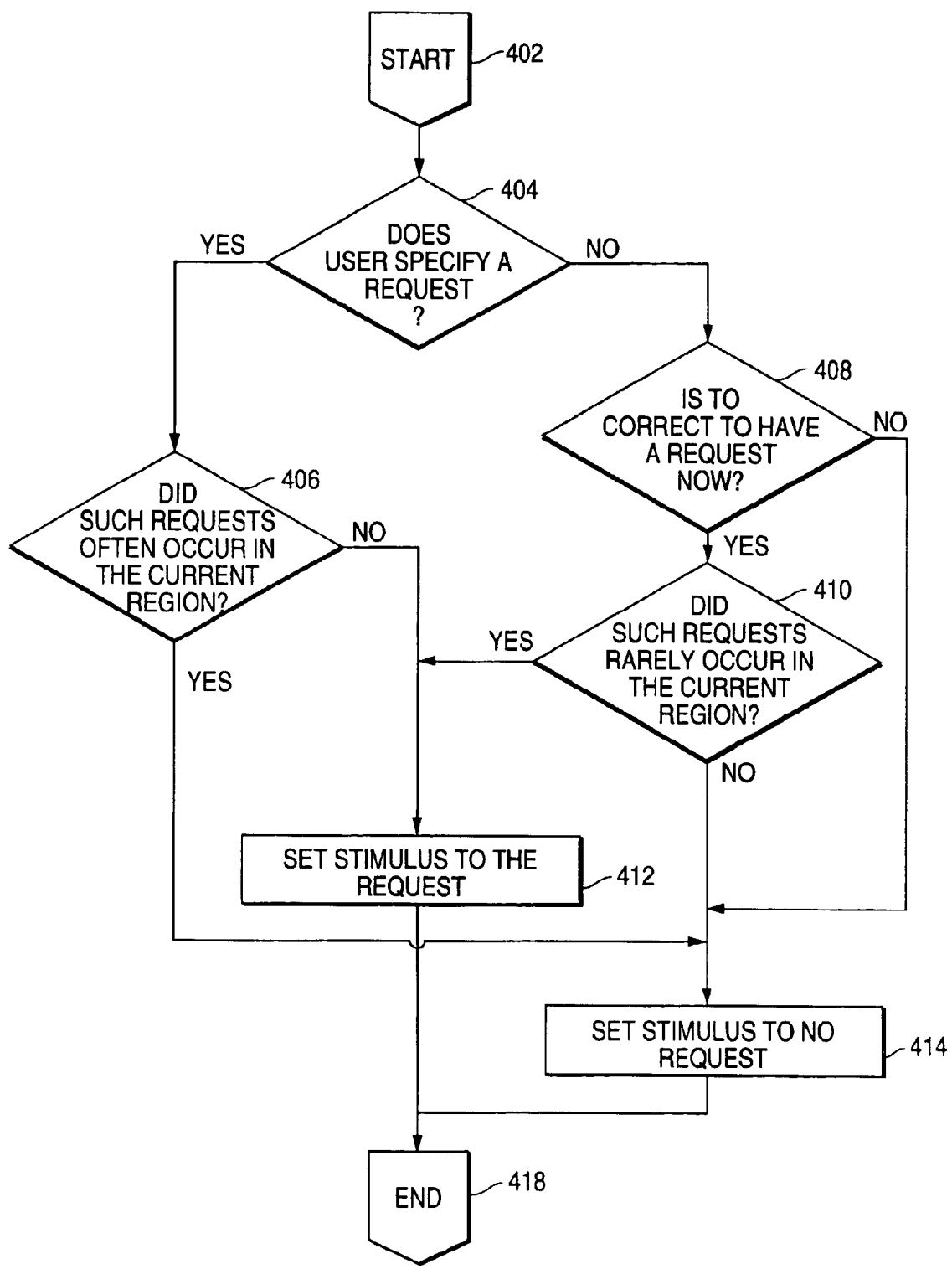
FIGS. 4A, 4B, and 4C show three different processes respectively for transforming a stimulus, in accordance with the present invention.
Figure 4B:
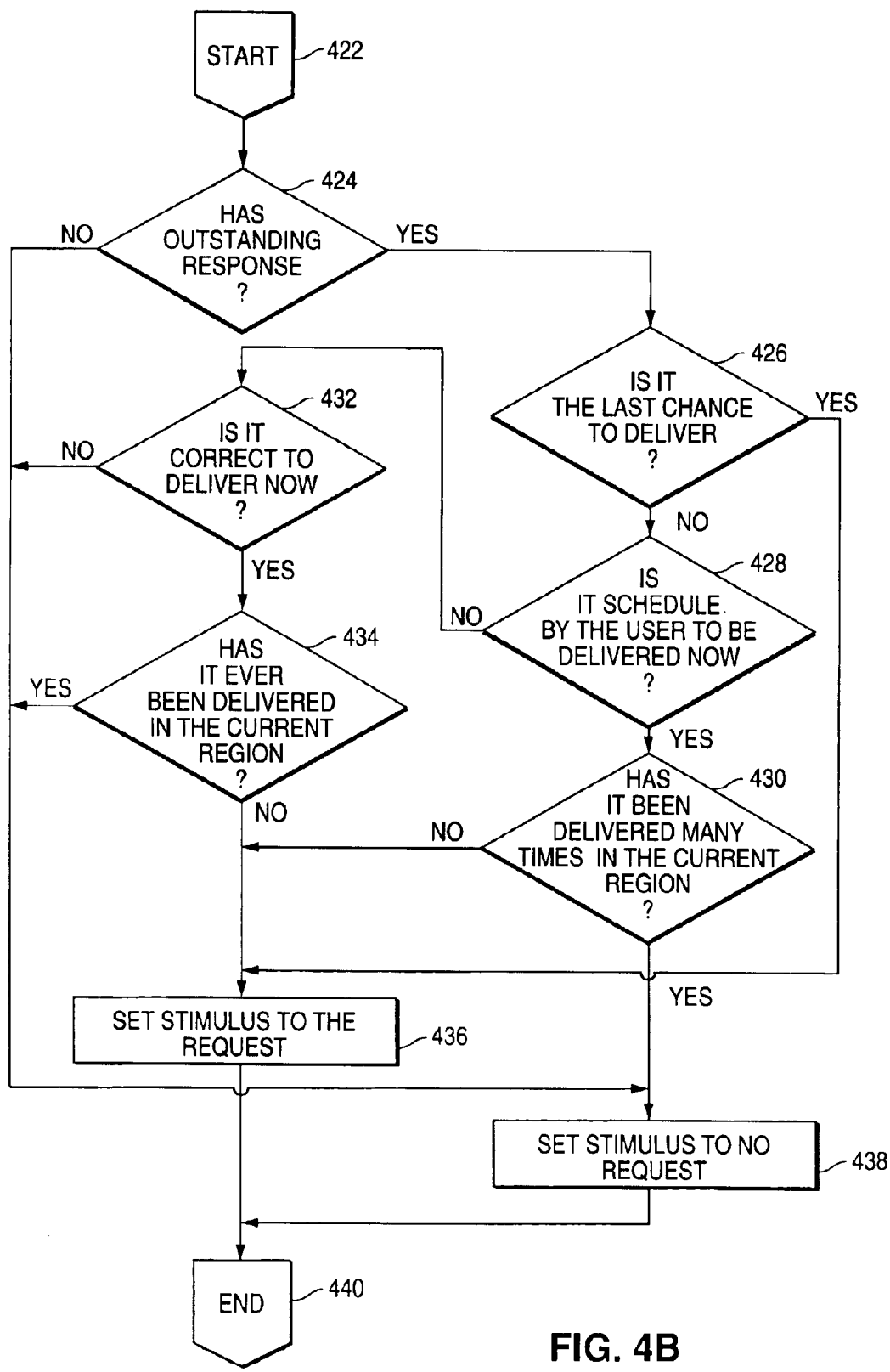
Figure 4C:
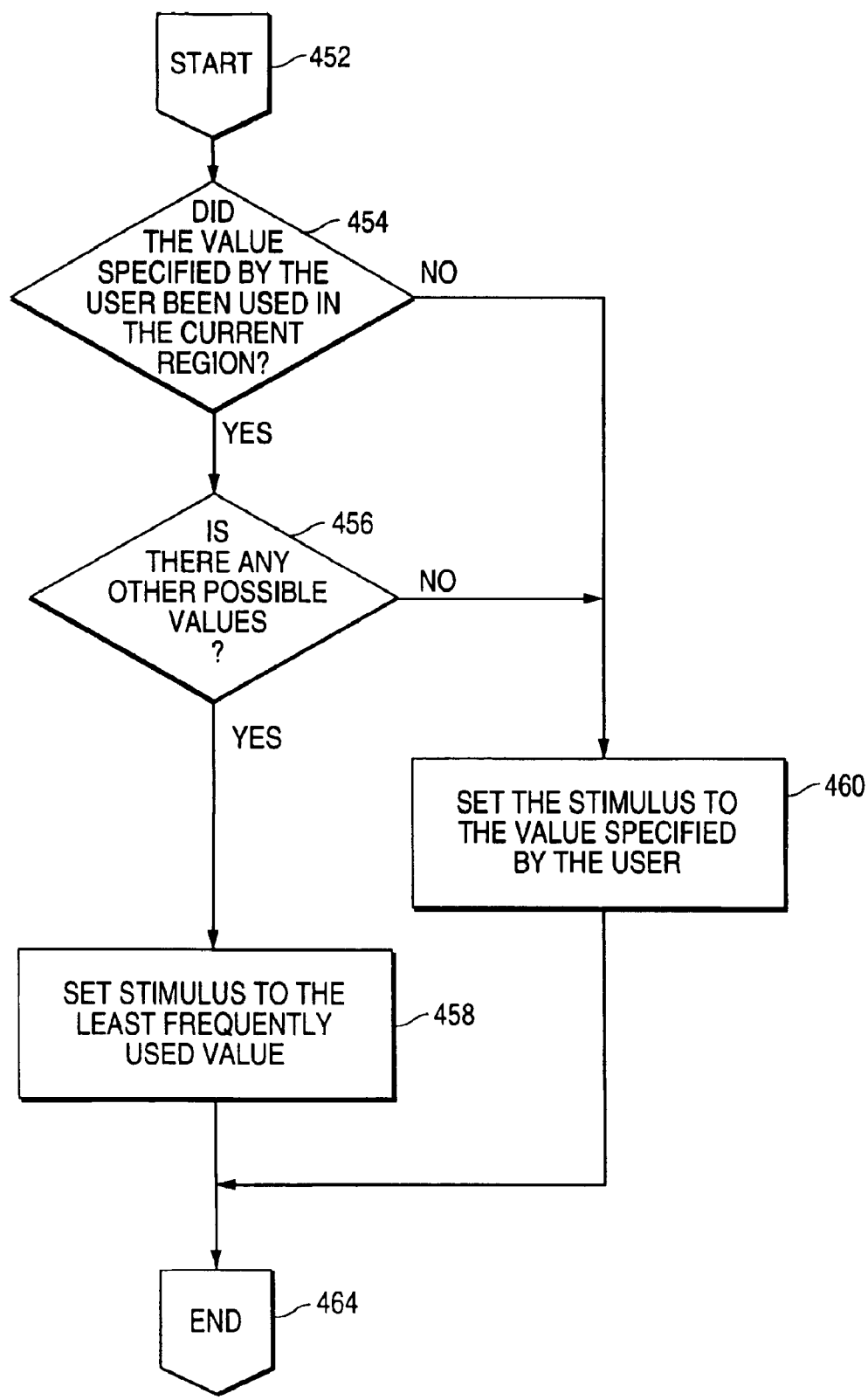

FIGS. 4A, 4B, and 4C show three different approaches illustrating three exemplary processes respectively for the step of selecting an interesting stimulus (step 320 in FIG. 3A, step 320' in FIG. 3B, or step 320''' in FIG. 3C), in accordance with the present invention. Usually, a digital design has many inputs with different characteristics. Each of the three approaches illustrates how one input of a particular type can be selected in isolation, without considering other inputs of the design. For designs with more than one input, one of the three flowcharts can be assigned to each input. It is also possible to combine the three flowcharts for multiple inputs into one process.

FIG. 4A shows a process of selecting whether to use a request as part of a stimulus in a situation where the environment of a design can spontaneously generate a particular request to a digital design. For example, in a memory controller design, whenever the memory bus is idle, a new request for a read-only copy of an address may be initiated by other agents (i.e. processors, peripherals, etc) at any time. In this case, the procedure shown in FIG. 4A can be used to select whether such a request should be used as part of a stimulus at the current state. If such a request is used, the bus signals will be driven to the value representing the request; if such a request is not used, the bus signals will be driven to the value representing no request. In the case when the controller may receive other requests through the same memory bus, such as a request from a writable copy of an address, multiple copies of the process performed by the flowchart shown in FIG. 4A may be used simultaneously.

As shown in FIG. 4A, step 404 determines whether the sequence of the stimuli provided by a designer specifies a request. If the sequence of the stimuli does not specify a request at the current simulation step, the operation is led to step 408. If the sequence of the stimuli has specified a request, the operation is led to step 406. It should be noted that if this step is used in conjunction with the simulation process shown in FIG. 3B, the operation is always led to step 408, because there is no designer specified request.

Step 406 checks the simulation history of the current region, as stored in the memory Region R to determine whether the number of occurrence of the request in the current region exceeds a predetermined value (1, 2, or 3, for example), and whether the time elapsed since the last request is longer than a predetermined time period (2, 4, or 6 time units, for example). If the number of occurrence exceeds the predetermined value for the current region, or the time elapsed is shorter than the predetermined time period, the operation is led to step 414. If the number of occurrence does not exceed the predetermined value for the current region, and the time elapsed is longer than the predetermined time period, the operation is led to step 412.

If the sequence of stimuli does not specify a request, step 408 further determines whether such a request would be legal for the current state, meaning that the request can occur in complying with the stimulus specification. For example, a request to write back a copy of a memory address can occur only after an agent has sent a request to get a writable copy of a memory address. If the request is not legal, the operation is led to step 414; if the request is legal, the operation is led to step 410.

Step 410 checks the simulation history for the current region, as stored in the memory Region R, to determine whether the number of occurrences of the request in the current region exceeds a predetermined value 1, 2, or 3, for example), and whether the time elapsed since the last request is longer than a predetermined time period (2, 4, or 6 time units, for example). If the number of occurrences of the request exceeds the predetermined value, or the time elapsed is shorter than the predetermined time period, the operation is led to step 414; if the number of occurrences of the request does not exceed the predetermined value, and the time elapsed is longer than the predetermined time period, the operation is led to step 412.

Step 412 issues the request by setting the inputs to the value representing the request. The operation is then led to step 418 to terminate the process.

Step 414 sets the inputs to the value representing no request. The operation is then led to step 418 to terminate the process.

After the process shown in FIG. 4A is terminated, step 322 in FIG. 3A, 322' in FIG. 3B, or 322''' in FIG. 3C updates the simulation history for the request used in the current region.

It should be appreciated that the process shown in FIG. 4A may generate a new stimulus and replace the stimulus taken at step 314 (shown in FIG. 3A or 3C) with the newly generated stimulus.

FIG. 4B shows a process of determining whether to deliver a response as part of a stimulus in a situation where the environment of a design has to provide responses to the requests from the digital design. For example, when a cache controller issues a request to its environment to get a read-only copy of a memory address, the response usually has to come in within a specific delay interval. In this situation, the environment can respond at any time within the interval, and the present invention can be used to deliver the response at interesting design states or interesting simulation times. Similar to the description in FIG. 4A, if there is more than one type of response, multiple instantiation of the flowchart can be used.

As shown in FIG. 4B, step 424 determines whether there exists an outstanding response. If there is no outstanding response, the operation is led to step 438. If there is an outstanding response, the operation is led to step 426.

Step 426 determines whether the environment of a design can further delay the delivery of the response. As discussed above, the simulation environment usually has to respond to a request within a specific delay interval. For example, when the current time is at the end of the delay interval and the response has not yet been delivered, the environment should not further delay the delivery of a response. If the environment can no longer delay the delivery of the response, the operation is led to step 436. If the environment can further delay the delivery of the response, the operation is led to step 428.

Step 428 determines whether the outstanding response is scheduled by the designer to be delivered at the current time. If the outstanding response is not scheduled by the designer to be delivered at the current time, the operation is led to step 432. If the outstanding response to scheduled by the designer to be delivered at the current time, the operation is led to step 430. It should be noted that if this step is used in conjunction with the simulation process shown in FIG. 3B, the operation is always led to step 432, because there is no designer specified schedule.

Step 430 checks the simulation history for the current validation region, as stored in the memory region R, to determine whether the number of deliveries of the response in the current region exceeds a predetermined value (1, 2, or 3, for example). If the number of deliveries of the outstanding response exceeds the predetermined value for the current validation region, the operation is led to step 438. If the number of deliveries of the outstanding response does not exceed the predetermined value for the current region, the operation is led to step 436.

When the outstanding request is not scheduled by the designer, step 432 determines whether the outstanding response can be delivered at the current time. For example, a protocol may specify that the response is to be delivered at least three time units after the request. Thus, if the current time is only two time units after the request, the request cannot be delivered at the current time. If the response can be delivered at the current time, the operation is led to step 438. If the response cannot be delivered at the current time, the operation is led to step 434.

Step 434 checks the simulation history for the current validation region, as stored in the memory region R, to determine whether the number of deliveries of the outstanding response in the current region exceeds a predetermined value (1, 2, or 3, for example). If the number of deliveries of the outstanding response exceeds the predetermined value for the current region, the operation is led to step 438. If the number of deliveries of the outstanding response does not exceed the predetermined value for the current region, the operation is led to step 436.

Step 436. delivers the outstanding response by setting the inputs to the value representing the response. The operation is then led to step 440 to terminate the process.

Step 438 sets the inputs to a value representing no response. The operation is then led to step 440 to terminate the process.

After the process shown in FIG. 4B is terminated, step 322 in FIG. 3A, step 322' in FIG. 3B, or step 322'" in FIG. 3C updates the simulation history (or record) for the response used in the current region.

It should be appreciated that the process shown in FIG. 4B may change the order of the sequence of the stimuli provided by the designer.

FIG. 4C shows a process of selecting a value for an input as part of a stimulus in a situation where the value of an input, regardless of whether it is a request, a response, or an instruction within a stream, can be selected to improve coverage. For example, when a cache controller issues a request, its simulation environment may have to respond at exactly three time units after a request was received. Thus, the process shown in FIG. 4B may not be suitable because the timing of the response is not flexible. However, there may exist many suitable responses, for example, one may be a reply with the appropriate data, and another may be a reply asking for retry.

On the other hand, the process in FIG. 4C can be considered as an alternative for executing multiple passes of the flowchart in FIG. 4A for different requests, or executing multiple passes of the flowchart in FIG. 4B for different responses. For example, a memory controller may receive requests for read-only copies of an address, requests for writable copies of an address, and requests to write back a new value to an address. In this case, the stimulus selection process may consists of executing three passes of the flowchart in FIG. 4A, one pass for each of the requests. On the other hand, it may execute one pass of the flowchart in Figure A to determine whether to generate a request, and if a request is used, execute one pass of the flowchart in FIG. 4C to determine which request to use as part of a stimulus.

As shown in FIG. 4C, step 454 checks the simulation history of the current validation region, as stored in the memory region R, to determine whether the number of occurrence of the value specified by the designer exceeds a predetermined value (1, 2, or 3, for example). If the number of occurrence of the value exceeds the predetermined value, the operation is led to step 460. If the number of occurrence of the value does not exceed the predetermined value, the operation is led to step 456. It should be noted that if this step is used in conjunction with the simulation process shown in FIG. 3B, the operation is always led to step 456, because there is no designer specified value.

Step 456 checks the stimulus specification to determine whether there are any possible values that can be used in the current validation region, other than the one specified by the user in the predetermined sequence of stimuli. If there are no other possible values, the process is led to step 460. If there is at least one other possible value, the process is led to step 458. It should be noted that if this step is used in conjunction with the simulation process shown in FIG. 3B, the operation is always led to step 458, because there is no designer specified value.

Step 458 checks the simulation history of the current validation region, as stored in the memory region R, to select a value having the smallest number of occurrence in the current validation region, and sets the inputs to the selected value. The operation is then led to step 464 to terminate the process.

Step 460 sets the inputs to the value specified by the designer. The operation is then led to step 464 to terminate the process.

After the process shown in FIG. 4C is terminated, step 322 in FIG. 3A, step 322' in FIG. 3B, or step 322'" in FIG. 3C updates the simulation history for the value used in the current region.

It should be appreciated that the process shown in FIG. 4C may generate a new stimulus and replace the stimulus taken at step 314 (shown in FIG. 3A or 3C) with the newly generated stimulus.

Figure 5A:
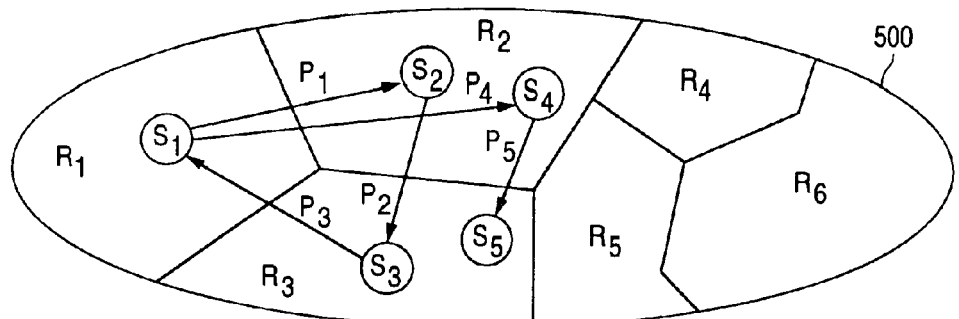
FIGS. 5A and 5B show an example of reducing simulation duplication in a simulation process, in accordance with the present invention.
Figure 5B:
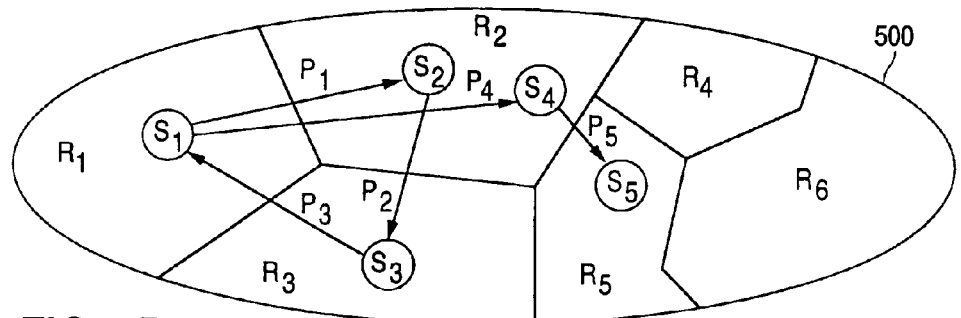

FIGS. 5A and 5B show an example of reducing simulation duplications in a simulation process, in accordance with the present invention.

In FIGS. 5A and 5B, the state space 500 is divided into six validation regions (R1–R6). The simulation process generates five design states (S1–S5). Each of the five arrow lines (P1–P5) represents a step (or transition) in the simulation process.

As shown in FIG. 5A, the conventional simulation process may use the same stimulus for the simulation steps in the states S2 and S4. These two simulation steps may generate two successor states that reach the same validation region (i.e. R3). As shown in FIG. 5B, the simulation process of the present invention selects a different interesting stimulus for the simulation step in state S4. This simulation step is more likely to generate a successor state that reaches a different validation region (i.e. R5).

Figure 6:
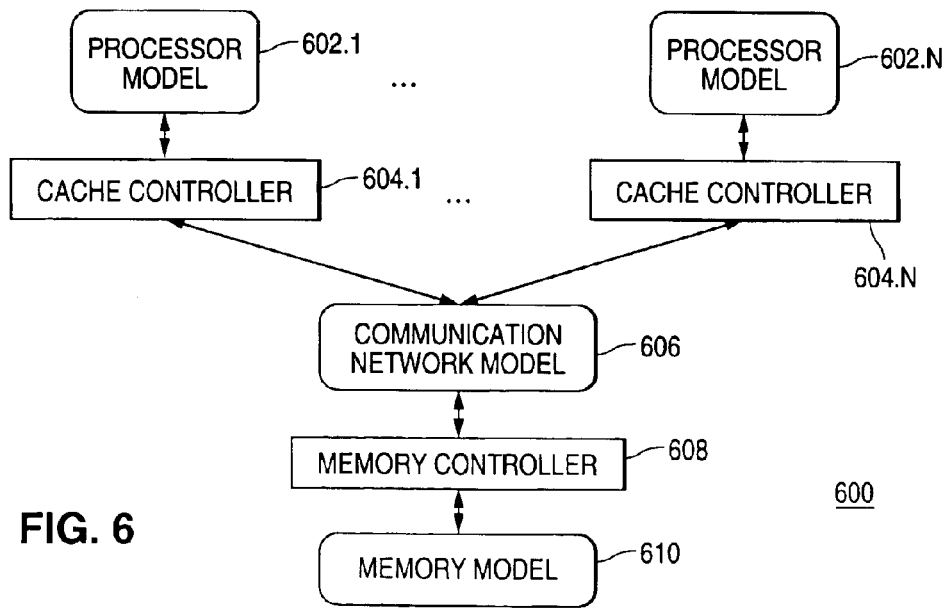
FIG. 6 shows an exemplary environment, in which a digital design is validated in accordance with the present invention.

FIG. 6 shows an exemplary environment, in which a circuit design is validated, in accordance with the present invention.

The design of interest includes a cache controller and a memory controller. One requirement of this design is to maintain the consistency of the data in a set of processor caches and a memory. Thus, the environment (or system) for the design includes a plurality of processors, a communication network, and a memory. To facilitate the simulation process, this environment is modeled as a plurality of simplified processor models, a simplified communication network model, and a simplified memory model.

Therefore, as shown in FIG. 6, the complete system for validating the design includes N processor models (602.1, 602.2, . . . , 602.N), N cache controllers (604.1, 604.2, . . . , 604.N), a communication model 606, a memory controller 608, and a memory model 610.

Each of the N processor models (602.1, 602.1, . . . , or 602.N) can spontaneously generate three different types of requests to its respective cache controller (604.1, 604.2, . . . , or 604.N): one type requesting a read-only copy of an address (read request), one type requesting a writable copy of an address (write request), one type requesting to write back the new value in the cache to the memory (write-back request). Each of the cache controllers (604.1, 604.2, . . . , or 604.N) of the design responds to the requests from its respective processor model (602.1, 602.2, . . . , or 602.N) and communicates with the memory controller 608 and memory model 610 by sending messages through the communication network 608. Each of the cache controllers (604.1, 604.2, . . . , or 604.N) can generate many different types of messages.

Upon receiving the messages from the N cache controllers (604.1, 604.2, . . . , 604.N), the communication network model 606 passes messages to the appropriate destination, with arbitrary delays.

Each of the memory controllers (604.1, 604.2, . . . , or 604.N) takes requests from the communication network model 606, processes it, and replies through the communication network model 606. Each of the memory controllers (604.1, 604.2, . . . , or 604.N) can generate many different types of messages. In combination, the cache controllers (604.1, 604.2, . . . , and 604.N) and the memory controller (608) can generate a total of 12 different types of messages.

To validate the cache controller and the memory controller in the digital design based on the environment (or system) shown in FIG. 6, a traditional simulation process takes the description of the whole system, and a sequence of test stimuli specifying a series of requests from each of the processor models (602.1, 602.2, . . . , or 602.N). The delays for the messages in the communication network model 606 are typically generated randomly by a random number generation, but it can also be specified manually by the designer. Therefore, the inputs to the design comprises spontaneous generation of three different types of requests from each of the N processor models (602.1, 602.2, . . . , 602.N), and the delivery of 12 different types of messages with arbitrary delays to the cache controllers (604.1, 604.2, . . . , 604.N) and the memory controller 608. The traditional simulation process suffers the shortcomings as described in connection with FIG. 1.

Compared to the traditional simulation process, the simulation process of the present invention involves six aspects as follows:

1. forming a validation state space;
2. dividing the state space into a plurality of validation regions;
3. matching a design state with a corresponding region;
4. recording simulation history for each validation region;
5. examining and transforming a stimulus; and
6. updating the simulation history for each validation region.

Figure 7:
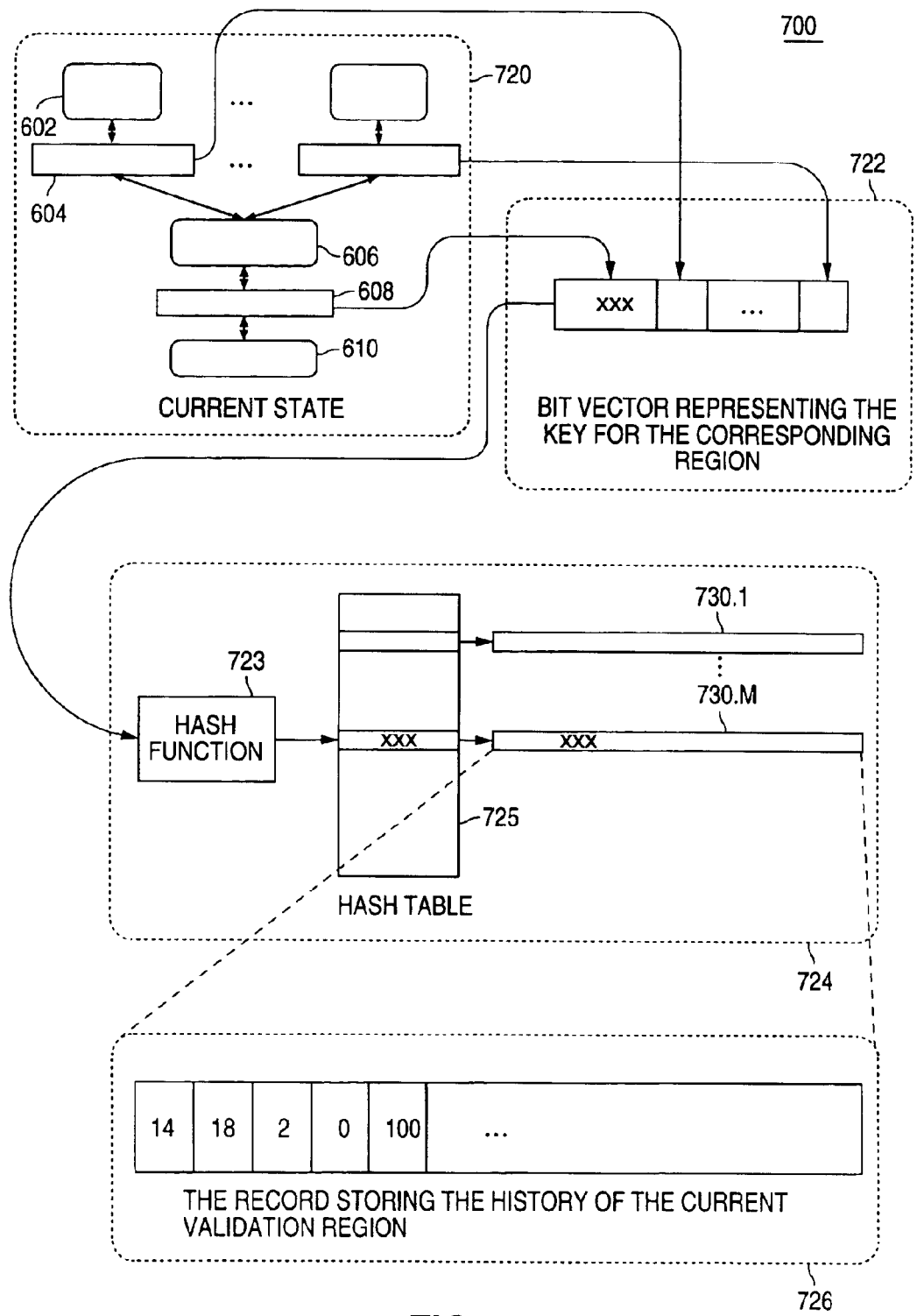
FIG. 7 shows some components to implement the novel aspects of the present invention.

FIG. 7 shows a block diagram 700 illustrating some components for implementing the above-noted novel aspects, in accordance with the present invention. The exemplary environment shown in FIG. 6 will be used in the discussion of FIG. 7 to so illustrate.

As shown in FIG. 7, the block diagram 720 shows the exemplary environment of FIG. 6 for the validation of the cache controller and the memory controller.

The block diagram 722 shows a buffer, in which the extracted values from a selected subset of state holding elements in the design can be stored. The arrows from block diagram 720 to diagram 722 show an example in which values of selected state holding elements in the cache controllers and the memory controller are copied to the buffer.

The block diagram 724 shows a usage of a hash table to store the stimulation history of each validation region. Taking the values in the buffer in the block diagram 722, a hash function shown in block 723 can compute a hash key for accessing the elements in the array shown in block 725. The block 725 is a large array with S elements, in which each element is a pointer pointing to another buffer. The buffer, which is pointed by the elements in the array, is labeled 730.1, 730.2, . . . , or 730.S. The hash key from block 723 selects a buffer from 730.1, 730.2, . . . , 730.S. The block diagram 726 shows the detail in one of the buffers in 730.1, 730.2, . . . , 730.S, which records that there have been 14 occurrences for the first kind of stimulus, 18 occurrences for the second kind of stimulus, etc.

Using the components in FIG. 7, the following discussion summarizes again the novel aspects of the present invention in the context of the exemplary design and environment shown in FIG. 6.

1. Forming a Validation State Space

In FIG. 6, the design state for each cache controller includes the values in all cache entries in the cache, all tags associated with the cache entries, and all entries in an auxiliary cache storing the outstanding requests. The memory controller needs to maintain a directory to determine which caches are currently caching a read-only copy or a writable copy of an address. This directory represents the state of the memory controller. There are no state holding elements in the processor model, but there are state holding elements in the memory model to store the actual values in the memory, and state holding elements in the communication network model to store the messages to be delivered.

Thus, for the system shown in FIG. 7, the current state in block 720 includes the values of the state holding elements in: (1) the N cache controllers (604.1, 604.2, . . . , 604.N), (2) the memory controller (608), (3) the collection of all outstanding messages in the communication network model (606), and (4) the memory model (610). There can be billions of different design states. Therefore, it is not feasible to perform formal verification on all the design states directly using the process in FIG. 2.

2. Dividing the State Space into Validation Regions

The values in a subset of the state holding elements in a design can be used to divide the state space into validation regions. The set of state holding elements is called the representative elements. For example, the tags associated with the cache entries in the cache controllers and the directory in the memory controller can be used as the subset of state holding elements to determine the set of validation regions. The states with the same value in their respective subset of state holding elements are regarded to be in the same validation region.

For example, if both state A and state B have invalid tags in all the cache entries, and the directory of the memory controller is empty, they belong to the same validation region, even though they may have different outstanding transactions in the communication network. If state C has a tag in cache controller 602.1 stating that the entry has a read-only copy of an address, it belongs to a different validation region than states A and B.

3. Matching a Design State with a Corresponding Region

As shown in FIG. 7 in block 722, a buffer is allocated in a memory region to store values extracted from the representative state holding elements. Each of the representative state holding elements has a corresponding slot in this buffer, as indicated by the arrows from block 720 to block 722. To determine the validation region for the current state, the values in the representative state holding elements are copied to the buffer in block 722. The hash function in block 724 converts the values in the buffer in block 722 to a hash key; and the buffer 730.M corresponding to the hash key defines the corresponding validation region for the current state. The data within the buffer 730.M corresponds to the simulation history of the validation region.

Although it is not shown in this example, it is also possible for the hash table to arbitrarily combine two validation regions into one to reduce memory usage.

4. Recording Simulation History for Each Validation Region

In FIG. 7, block 726 shows a buffer corresponding to one of the buffers in 730.1, 730.2, . . . , 730.S, storing the simulation history for one validation region. In this buffer, the simulation history contains N+1 sections, one for each of the N cache controllers (604.1, 604.2, . . . , or 604.N), and one for the memory controller 608.

Specifically, the section of the simulation history that corresponds to a cache controller (604.1, 604.2, . . . , or 604.N) contains 15 bytes, each byte recording the number of occurrences of a processor request (a total of three different requests) or the number of deliveries of a particular message type (a total of 12 different message types) to the corresponding cache controller. Since each byte can only store a value between 0 and 255, the value 255 is used to denote more than 254 occurrences. The buffer in block 726 shows that there have been 14 occurrences of the first kind of request when the current state is in the validation region corresponding to this buffer, 18 for the second kind of request, etc.

The section of the simulation history that corresponds to the memory controller 608 contains 12 bytes, each byte recording the number of deliveries of a particular message type (a total of 12 different message types) to the memory controller. Similarly, the value 255 is used to denote more than 254 occurrences.

5. Examining and Transforming a Stimulus

When a stimulus is taken to perform the next stimulation step for a design state, the simulation history for the design state needs to be identified. First, the values of the corresponding state holding elements are retrieved from the current state and put into the buffer in block 722. The values in this buffer are then used as a key to retrieve a buffer storing the simulation history from the hash table in block 724.

The stimulus used to perform the stimulation step includes requests from one of the N processor models (602.1, 602.2, . . . , or 602.N), and messages that are delivered from the communication network 606. For example, the predetermined sequence of test stimuli may specify the issue of a read request from a first processor model (602.1), together with the delivery of an acknowledgement message to a second cache controller (604.2) at time unit 100, and a read request from a third processor model (602.3) at time unit 256. A transformed stimulus may remove the read request at time unit 100, and add another read request from the third processor model (602.3) at time unit 126.

Several instantiations of different flowcharts (FIG. 4A, 4B, or 4C) may be executed to transform the predetermined sequence of test stimuli. For each of the processor models, the flowchart from FIG. 4A may be executed to determine whether to issue a request, and the flowchart from FIG. 4C may be executed to determine which of the three requests should be used (because two different requests cannot be issued at the same time from the same processor model). For each of the cache controllers (604.1, 604.2, . . . , or 604.N) and the memory controller (608), 12 instantiations of the flowchart in FIG. 4B may be executed to determine whether to deliver a message of a particular type. A total of 14N+12 instantiations of the flowcharts are used; however, the overhead is small because many instantiations of the flowcharts are only executed when a certain type of message exists in the communication network model 606.

For example, an instantiation of the flowchart in FIG. 4A for the first cache controller (604.1) may be performed as follows: (1) the simulation history corresponding to the current validation region is retrieved, and (2) the three bytes corresponding to the requests from the first processor model (602.1) are examined. If the sum of them are smaller than a predetermined value specified by the user, and the time elapsed since the last request is also larger than another predetermined value specified by the user, a request will be used as a stimulus for the next simulation step. In this case, the flowchart in FIG. 4C for the first cache controller (604.1) will be executed. If the same three bytes in the simulation history show that there have been more read requests and write requests than a write-back request, and the stimulus specification shows that a write-back request can occur in the current state, a write-back request will be used as part of the stimulus for the next simulation step.

6. Updating the Simulation History for Each Validation Region

A taken or a transformed stimulus comprises requests from the processor model (602.1, 602.2, . . . , or 602.N), and messages that are delivered from the communication network 606. In order to update the simulation history corresponding to the current validation region, the buffer (730.M) corresponding to the current validation region is retrieved from the hash table in block 724.

If the stimulus includes a request to one of the cache controllers (604.1, 604.2, . . . , or 604.N), the byte in the record corresponding to the request is incremented. If the message is delivered to a controller, the byte corresponding to the message type and the controller is incremented.

Components similar to those in FIG. 7 can also be used for the embodiment of the present invention shown in FIG. 3C, in which multiple divisions of the state space are used.

A particular digital design may have multiple (M) inputs (or fields). Hence, each of the testing stimuli for the digital design has M values corresponding to its respective M inputs (M>=2). Because different inputs in a stimulus have different characteristics, it is often better to divide the state space differently for different inputs in a stimulus. Consider the inputs of the first cache controller (604.1) as requests from the first processor model (602.1) and messages from other controllers. Instead of including the tags in all cache controllers as the representative state holding elements to define the division of the state space, a different division can be defined by including only the tags in the first cache controller. Using the same approach to the other cache controller and maintaining the original division for the memory controller, we have obtained N+1 different state space divisions, one for each cache controller and one for the memory controller.

A separate hash table similar to the one in block 724 is associated with each way of dividing the state space, and therefore, providing for N+1 different hash tables. The buffers in the hash table associated with the first cache controller are similar to the buffer in block 726, but each of the buffers has only one section, and the section has 15 bytes, with each byte recording the number of occurrences of a processor request or the number of deliveries of a particular message type to the first cache controller only. Similarly for the other hash tables, the buffers in the table are similar to the one in block 726, but each of buffers is smaller.

In order to transform the requests from the first processor model (602.1) to the first cache controller (604.1), an instantiation of the flowchart in FIG. 4A for the first cache controller (604.1) may be performed as follows: (1) the simulation history corresponding to the current validation region for the first cache controller is retrieved from the first hash table, and (2) the three bytes corresponding to the requests from the first processor model (602.1) are examined. The execution of the flow chart is carried out in the same way as the previous example.

Figure 8:
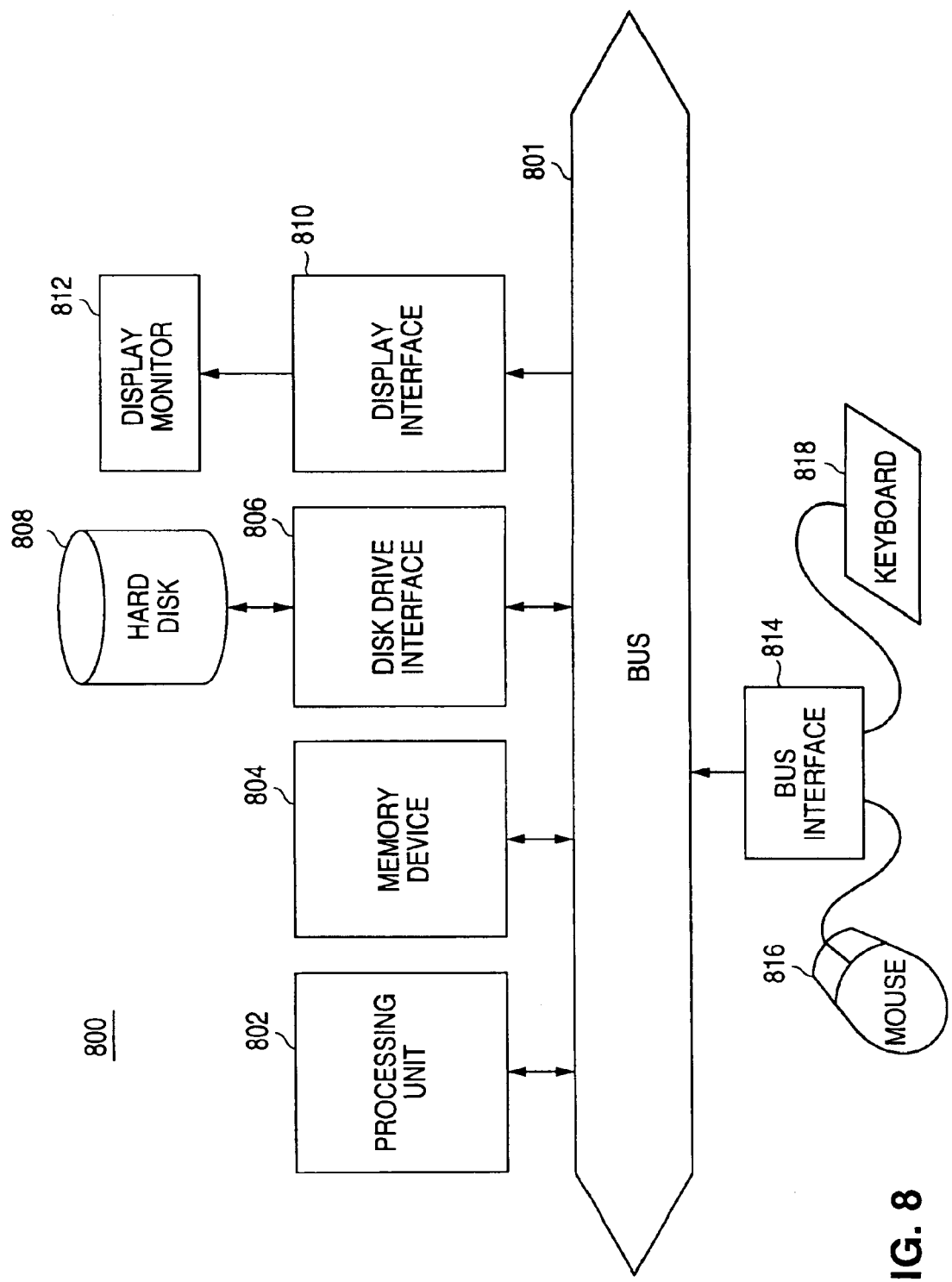
FIG. 8 shows a block diagram illustrating an exemplary computer system, which can be used as a hardware platform to perform the simulation process, in accordance with the present invention.

FIG. 8 shows a block diagram illustrating an exemplary computer system 800, which can be used as a hardware platform for running the program to perform the simulation process, in accordance with the present invention.

As shown in FIG. 8, the computer system 800 includes a system bus 801, a processing unit 802, a memory device 804, a disk drive interface 806, a hard disk 808, a display interface 810, a display monitor 812, a serial bus interface 814, a mouse 816, and a keyboard 818.

The hard disk 808 is coupled to the disk drive interface 806; the monitor display 812 is coupled to the display interface 810; and the mouse 816 and keyboard 818 are coupled to the serial bus interface 814. Coupled to the system bus 801 are the processing unit 802, the memory device 804, the disk drive interface 806, and the display interface 810.

Memory device 804 stores data and programs (including instructions). Operating together with the disk drive interface 806, the hard disk 808 also stores data and programs. However, memory device 804 has faster access speed than hard disk 808, while the hard disk 808 has higher capacity than memory device 804.

Operating together with the display interface 810, the display monitor 812 provides visual interfaces between the programs being executed and users, and displays the outputs generated by the programs.

Operating together with the serial bus interface 814, the mouse 816 and keyboard 818 provide inputs to the computer system 800.

The processing unit 802, which may include more than one processor, controls the operations of the computer system 800 by executing the programs stored in the memory device 804 and hard disk 808. The processing unit also controls the transmissions of data and programs between the memory device 804 and the hard disk 808.

The program for performing the simulation process shown in FIGS. 3A–C, 4A–C, 6, and 7 can be stored in the memory device 804 or hard disk 808, and executed by the processing unit 802.

While the invention has been illustrated and described in detail in the drawing and foregoing description, it should be understood that the invention may be implemented through alternative embodiments within the spirit of the present invention. Thus, the scope of the invention is not intended to be limited to the illustration and description in this specification, but is to be defined by the appended claims.

What is claimed is:

1. A method for performing a simulation process for a design using a set of existing stimuli that are specified in a predetermined sequence, the method comprising the steps of:

dividing all possible design states for the design into a plurality of validation regions;

recording simulation history for all the validation regions during the simulation process;

hashing representative state values of each corresponding validation region via a plurality of hashing devices, each hashing device corresponding to one of the validation regions, storing the hashed representative state values of each validation region in a hash table of the corresponding validation region hashing device;

retrieving simulation history stored in the hashed representative state values using the corresponding hash table and a corresponding hash key;

generating a new set of stimuli by examining the existing stimuli based on the retrieved simulation history; and performing the simulation process using the new set of stimuli.

2. The method of claim 1, wherein the new set of stimuli is generated by substituting at least one of the existing stimuli with a new stimulus based on the simulation history.

3. The method of claim 1, wherein the new set of stimuli is generated by changing the order in the sequence of the existing stimuli based on the simulation history.

4. The method according to claim 3, further comprising the step of:
hashing representative state values of a validation region and storing the hashed values in a hash table; and
retrieving simulation history stored in the hashed representative state values using the hash table and a hash key.

5. The method according to claim 4, further comprising the step of updating a simulation history for each validation region.

6. The method according to claim 5, further comprising the step of arbitrarily combining multiple validation regions in said hash table.

7. The method of claim 1, wherein:
the specified stimuli indicates all possible stimuli that may occur; and
the simulation includes a verification process that exhaustively verifies all possible stimuli one by one.

8. The method according to claim 1, further comprising the steps of:
dividing a memory into a first memory region and a second memory region;
storing a current state of the simulation in the first memory area; and
storing the simulation history in the second memory area.

9. A method for performing a simulation process for a design using a set of existing stimuli that are specified in a predetermined sequence, the method comprising the steps of:
dividing all possible validation states for the design into a plurality of validation regions;
recording simulation history for each of the validation regions during the simulation process;
taking a stimulus from the existing stimuli for performing a next simulation step for a current validation region, wherein the stimulus is taken in an order specified by the predetermined sequence;
hashing representative state values of each corresponding validation region via a plurality of hashing devices, each hashing device corresponding to one of the validation regions,
storing the hashed representative state values of each validation region in a hash table of the corresponding validation region hashing device;
retrieving simulation history stored in the hashed representative state values using the corresponding hash table and a corresponding hash key;
examining the retrieved simulation history for the taken stimulus in the current validation region; and
transforming the taken stimulus into an interesting stimulus based on the simulation history.

10. The method of claim 9, wherein the step of transforming improves simulation efficiency and simulation coverage.

11. The method of claim 9, wherein the taken simulation stimulus validates one of the validation regions, and the transformed simulation stimulus validates another one of the validation regions.

12. The method of claim 9, the simulation history including a number of occurrences for stimuli that have used in each of the validation regions during the simulation process, the step of transforming further comprising the steps of:
determining whether the number of occurrence of the taken stimulus in the current validation region exceeds a predetermined value;
using the taken stimulus as a stimulus in a subsequent step of the simulation process, if the number of occurrence for the taken stimulus does not exceed the predetermined value; and
selecting a stimulus from the set of stimuli with the least number of occurrences for the current validation region, and using the selected stimulus in a subsequent step of the simulation process, if the number of occurrences for the taken stimulus exceeds the predetermined value.

13. The method of claim 9, further comprising the steps of:
receiving a stimulus specification; and
determining whether the taken stimulus is legal according to the stimulus specification.

14. The method of claim 9, further comprising the step of:
updating the simulation history for the current simulation region.

15. A method for performing a simulation process for a design using a stimulus specification, the method comprising the steps of:
dividing all possible design states for the design into a plurality of validation regions;
recording simulation history for each of the validation regions during the simulation process;
representative state values of each corresponding validation region via a plurality of hashing devices, each hashing device corresponding to one of the validation regions,
storing the hashed representative state values of each validation region in a hash table of the corresponding validation region hashing device;
retrieving simulation history stored in the hashed representative state values using the corresponding hash table and a corresponding hash key; and
generating an interesting stimulus in accordance with the stimulus specification based on the retrieved simulation history of the validation regions.

16. The method of claim 15, the simulation history including a number of occurrences for stimuli used in each of the validation regions during the simulation process, the step of transforming further comprising the steps of:
selecting a stimulus in accordance with the stimulus specification with the least number of occurrence for the current validation region, and using the selected stimulus in a subsequent step of the simulation process.

17. The method of claim 15, further comprising the step of:
updating the simulation history for the current simulation region.

18. A method for performing a simulation process for a design using a set of existing stimuli that are specified in a predetermined sequence, the design having M (M>=2) inputs, and each of the stimuli having M values for its respective M inputs, the method comprising the steps of:
dividing all possible design states into N (N>=2) different partitions for the design, each of the partitions dividing the design states into a plurality of validation regions;

associating each of the design inputs with one of the partitions, so that each of the validation regions in each of the partitions is associated with a set of design inputs;

recording simulation history for each of the validation regions in each of the partitions during the simulation process;

taking a stimulus from the set of stimuli for the next simulation step, wherein the stimulus is taken in an order specified by the predetermined sequence;

hashing representative state values of each corresponding validation region via a plurality of hashing devices, each hashing device corresponding to one of the validation regions, storing the hashed representative state values of each validation region in a hash table of the corresponding validation region hashing device;

retrieving simulation history stored in the hashed representative state values using the corresponding hash table and a corresponding hash key;

examining the retrieved simulation history for the value in each of the design inputs within the taken stimulus; and transforming the taken stimulus into an interesting stimulus based on the simulation history.

19. The method of claim 18, wherein the step of transforming improves simulation efficiency and simulation coverage.

20. The method of claim 18, wherein the taken simulation stimulus validates one of the validation regions, and the transformed simulation stimulus validates another one of the validation regions.

21. The method of claim 18, the simulation history including a number of occurrences for each of the values in the sequence of transformed stimuli for the design inputs associated with each of the validation regions during the simulation process, the step of transforming further comprising the steps of:

determining whether the number of occurrence of each of the values in each of the design inputs within the taken stimulus in the current validation region associated with the corresponding input exceeds a predetermined value;

using the taken stimulus as a stimulus in a subsequent step of the simulation process, if the number of occurrences for the value of each of the design inputs does not exceed the predetermined value; and selecting a value for an design input from the set of values with the least number of occurrences for the current validation region associated with the corresponding input, and using the selected value for the design input in a subsequent step of the simulation process, if the number of occurrences for the value of the design input exceeds the predetermined value.

22. The method of claim 18, further comprising the steps of:

receiving a stimulus specification; and determining whether the taken stimulus is legal according to the stimulus specification.

23. The method of claim 18, further comprising the step of:

updating the simulation history for the current simulation regions associated with all design inputs.

24. An apparatus for performing a simulation process for a design using a set of existing stimuli that are specified in a predetermined sequence, the apparatus comprising:

means for dividing all possible design states for the design into a plurality of validation regions;

means for recording simulation history for all the validation regions during the simulation process;

a plurality of hashing means, comprising one hashing means corresponding to each validation region;

wherein each hashing means comprises hashing representative state values of the corresponding validation region, a hash table for the corresponding validation region, means for storing the hashed values in the corresponding hash table, and retrieving means for retrieving simulation history stored in the hashed representative state values using the corresponding hash table and a corresponding hash key;

means for generating a new set of stimuli by examining the existing stimuli based on the retrieved simulation history; and means for performing the simulation process using the new set of stimuli.

25. The apparatus of claim 24, further including: means for substituting at least one of the existing stimuli with a new stimulus based on the simulation history.

26. The apparatus of claim 24, further including: means for changing the order in the sequence of the existing stimuli based on the simulation history.

27. An apparatus for performing a simulation process for a design using a set of existing stimuli that are specified in a predetermined sequence, the apparatus comprising:

means for dividing all possible validation states for the design into a plurality of validation regions;

means for recording simulation history for each of the validation regions during the simulation process;

means for taking a stimulus from the existing stimuli for performing a next simulation step for a current validation region, wherein the stimulus is taken in an order specified by the predetermined sequence;

a plurality of hashing means, comprising one hashing means corresponding to each validation region;

wherein each hashing means comprises hashing representative state values of the corresponding validation region, a hash table for the corresponding validation region, means for storing the hashed values in the corresponding hash table, and retrieving means for retrieving simulation history stored in the hashed representative state values using the corresponding hash table and a corresponding hash key;

means for examining the retrieved simulation history for the taken stimulus in the current validation region; and means for transforming the taken stimulus into an interesting stimulus based on the simulation history.

28. The apparatus of claim 27, wherein the taken stimulus is transformed to improve simulation efficiency and simulation coverage.

29. The apparatus of claim 27, wherein the taken simulation stimulus validates one of the validation regions, and the transformed simulation stimulus validates another one of the validation regions.

30. The apparatus of claim 27, the simulation history including a number of occurrences for stimuli that have used in each of the validation regions during the simulation process, the apparatus further comprising:

means for determining whether the number of occurrence of the taken stimulus in the current validation region exceeds a predetermined value;

means for using the taken stimulus as a stimulus in a subsequent step of the simulation process, if the number of occurrence for the taken stimulus does not exceed the predetermined value; and means for selecting a stimulus from the set of stimuli with the least number of occurrences for the current validation region, and using the selected stimulus in a subsequent step of the simulation process, if the number of occurrences for the taken stimulus exceeds the predetermined value.

31. The method of claim 27, further comprising:
means for receiving a stimulus specification; and
means for determining whether the taken stimulus is legal according to the stimulus specification.

32. The method of claim 27, further comprising:
means for updating the simulation history for the current simulation region.

33. An apparatus for performing a simulation process for a design using a stimulus specification, the apparatus comprising:
means for dividing all possible design states for the design into a plurality of validation regions;
means for recording simulation history for each of the validation regions during the simulation process;
a plurality of hashing means, comprising one hashing means corresponding to each validation region;
wherein each hashing means comprises hashing representative state values of the corresponding validation region, a hash table for the corresponding validation region, means for storing the hashed values in the corresponding hash table, and retrieving means for retrieving simulation history stored in the hashed representative state values using the corresponding hash table and a corresponding hash key; and
means for generating an interesting stimulus in accordance with the retrieved stimulus specification based on the simulation history of the validation regions.

34. The apparatus of claim 33, the simulation history including a number of occurrences for stimuli used in each of the validation regions during the simulation process, the apparatus further comprising:
means for selecting a stimulus in accordance with the stimulus specification with the least number of occurrence for the current validation region, and using the selected stimulus in a subsequent step of the simulation process.

35. The apparatus of claim 33, further comprising:
means for updating the simulation history for the current simulation region.

36. An apparatus for performing a simulation process for a design using a set of existing stimuli that are specified in a predetermined sequence, the design having M (M>=2) inputs, and each of the stimuli having M values for its respective M inputs, the apparatus comprising:
means for dividing all possible design states into N (N>=2) different partitions for the design, each of the partitions dividing the design states into a plurality of validation regions;
means for associating each of the design inputs with one of the partitions, so that each of the validation regions in each of the partitions is associated with a set of design inputs;
means for recording simulation history for each of the validation regions in each of the partitions during the simulation process;
means for taking a stimulus from the set of stimuli for the next simulation step, wherein the stimulus is taken in an order specified by the predetermined sequence;
means for examining the simulation history for the value in each of the design inputs within the taken stimulus; and means for transforming the taken stimulus into an interesting stimulus based on the simulation history; and
a plurality of hashing means, comprising one hashing means corresponding to each validation region;
wherein each hashing means comprises hashing representative state values of the corresponding validation region, a hash table for the corresponding validation region, means for storing the hashed values in the corresponding hash table, and retrieving means for retrieving simulation history stored in the hashed representative state values using the corresponding hash table and a corresponding hash key.

37. The apparatus of claim 36, wherein the taken stimulus is transformed to improve simulation efficiency and simulation coverage.

38. The apparatus of claim 36, wherein the taken simulation stimulus validates one of the validation regions, and the transformed simulation stimulus validates another one of the validation regions.

39. The apparatus of claim 36, the simulation history including a number of occurrences for each of the values in the sequence of transformed stimuli for the design inputs associated with each of the validation regions during the simulation process, the apparatus further comprising:
means for determining whether the number of occurrence of each of the values in each of the design inputs within the taken stimulus in the current validation region associated with the corresponding input exceeds a predetermined value;
means for using the taken stimulus as a stimulus in a subsequent step of the simulation process, if the number of occurrences for the value of each of the design inputs does not exceed the predetermined value; and
means for selecting a value for an design input from the set of values with the least number of occurrences for the current validation region associated with the corresponding input, and using the selected value for the design input in a subsequent step of the simulation process, if the number of occurrences for the value of the design input exceeds the predetermined value.

40. The apparatus of claim 36, further comprising:
means for receiving a stimulus specification; and
means for determining whether the taken stimulus is legal according to the stimulus specification.

41. The apparatus of claim 36, further comprising:
means for updating the simulation history for the current simulation regions associated with all design inputs.

42. The apparatus according to claim 36, wherein each corresponding hash key comprise state holding elements.

43. The apparatus according to claim 42, further comprising:
a series of processor models configured to apply stimulus in the form of requests, each request being implemented as a stimulus only if either a user makes the request and such request do not occur often in a current region or the user did not make the request and such request only occur infrequently in the current region.

44. The apparatus according to claim 36, further comprising:
a series of caches configured to store state holding elements; and
a memory controller configured to maintain a directory of caches representing states of the memory controller.

* * * * *